United States Patent
Sugiura

(10) Patent No.: US 7,202,421 B2
(45) Date of Patent: Apr. 10, 2007

(54) ELECTRONIC ELEMENTS, METHOD FOR MANUFACTURING ELECTRONIC ELEMENTS, CIRCUIT SUBSTRATES, METHOD FOR MANUFACTURING CIRCUIT SUBSTRATES, ELECTRONIC DEVICES AND METHOD FOR MANUFACTURING ELECTRONIC DEVICES

(75) Inventor: Yoshihiro Sugiura, Okaya (JP)

(73) Assignee: Seiko Epson Corporation (JP)

( * ) Notice: Subject to any disclaimer, the term of this patent is extended or adjusted under 35 U.S.C. 154(b) by 314 days.

(21) Appl. No.: 10/768,383

(22) Filed: Jan. 28, 2004

(65) Prior Publication Data

US 2004/0247840 A1 Dec. 9, 2004

(30) Foreign Application Priority Data

Jan. 30, 2003 (JP) .............................. 2003-022008

(51) Int. Cl.
*H01R 12/04* (2006.01)
*H01R 9/00* (2006.01)
*H05K 1/11* (2006.01)
*H05K 3/00* (2006.01)

(52) U.S. Cl. .................. 174/267; 174/260; 174/261; 29/842

(58) Field of Classification Search ............... 174/267, 174/260–266; 257/737–738; 29/842
See application file for complete search history.

(56) References Cited

U.S. PATENT DOCUMENTS 5,349,500 A * 9/1994 Casson et al. .............. 361/749
6,055,723 A * 5/2000 Akerling et al. .............. 29/843
6,490,170 B2 * 12/2002 Asai et al. ................... 361/794
2001/0042923 A1 * 11/2001 Yanagida ..................... 257/779

FOREIGN PATENT DOCUMENTS

| JP | 52-124861 | 10/1977 |
| JP | 57-170554 | 10/1982 |
| JP | 64-042153 | 2/1989 |
| JP | 10-189634 | 7/1998 |
| JP | 10-199886 | 7/1998 |

OTHER PUBLICATIONS

Communication from Japanese Patent Office regarding counterpart application.

* cited by examiner

*Primary Examiner*—Tuan Dinh
*Assistant Examiner*—Jeremy C. Norris
(74) *Attorney, Agent, or Firm*—Harness, Dickey & Pierce, P.L.C.

(57) ABSTRACT

A dielectric film is formed over the entire surface of a wafer having a plurality of electrode pads in a manner to expose the electrode pads, a first UBM that is a first metal layer is formed over the electrode pad and the dielectric film, a second UBM that is a second metal layer is formed on the first UBM, and a bump is formed by an electroplating processing over the electrode pad through the first and second UBMs, such that the first UBM is formed to be broader than the bottom area of the bump. In this case, since the first UBM is formed to be broader than the bottom area of the bump, the adhesion supporting force of the bump at the first UBM is increased, and consequently, the adhesion of the bump with the electrode pad through the first UBM can be improved.

11 Claims, 6 Drawing Sheets

ELECTRONIC ELEMENTS, METHOD FOR MANUFACTURING ELECTRONIC ELEMENTS, CIRCUIT SUBSTRATES, METHOD FOR MANUFACTURING CIRCUIT SUBSTRATES, ELECTRONIC DEVICES AND METHOD FOR MANUFACTURING ELECTRONIC DEVICES

RELATED APPLICATIONS

The present application claims priority to Japanese Patent Application No. 2003-022008 filed Jan. 30, 2003 which is hereby expressly incorporated by reference.

BACKGROUND OF THE INVENTION

1. Technical Field

The present invention relates to electronic elements, circuit substrates, electronic devices, a method for manufacturing electronic elements, a method for manufacturing circuit substrates, and a method for manufacturing electronic devices.

2. Related Technology

Among methods for mounting an electronic element on a circuit substrate having a wiring pattern, a flip-chip method is known. In the flip-chip method, a bump is disposed on a surface of an electronic element, the surface having the bump formed thereon is opposed to a circuit substrate having a wiring pattern, and the bump is connected to the wiring pattern, to thereby connect the electronic element to the circuit substrate.

FIG. 6 shows one example of an electronic element 61 having a bump that is formed by an electroplating method over an electrode pad through UBM (Under Bump Metal), wherein a dielectric film 53 is formed over an electrode pad 52, UBM layers 54 and 56 are formed thereon, and an electrode post 58 composed of Ni and a bump 59 composed of Sn—Ag are further formed on the UBM 56 by an electroplating process.

In the conventional method for forming the bump 59 by an electroplating process, the surface area of the UBM layers 54 and 56 is generally the same as the bottom area of the bump 59. Also, the size of the bump 59 has become smaller to accommodate the size of the substrate 51a and the number of the electrode pads 52. For this reason, the bottom area of the bump 59 has become smaller, and the surface area of the UBM layers 54 and 56 has become smaller accordingly. The adhesion of the materials that compose the UBM layer 54 and the dielectric film 53 is lower than the adhesion of the materials composing the UBM 54 and the UBM 56 or the UBM 56 and the bump 59. When the surface area of the UBM 54 becomes smaller, the adhesion of the dielectric film 53 and the UBM 54 may become lower compared to the adhesion at the interface of the other layers. In this case, at the time when or after the electronic element 61 is mounted on the circuit substrate having the wiring pattern, peeling at the interface between the UBM 54 and the dielectric film 53 would likely occur.

The present invention is made in view of such circumstances, and provides electronic elements, circuit substrates, electronic devices, a method for manufacturing electronic elements, a method for manufacturing circuit substrates, and a method for manufacturing electronic devices, which improve adhesion of electrode pads and bumps.

SUMMARY

An electronic element in accordance with the present invention is characterized in comprising: a substrate having an electrode pad; a dielectric film provided on a surface of the substrate having the electrode pad in a manner to expose the electrode pad; a first metal layer formed on the electrode pad; a second metal layer formed on the first metal layer; and a bump formed through the first and second metal layers over the electrode pad, wherein a surface area of one of the first metal layer and the second metal layer is formed to be larger than a bottom area of the bump.

Also, a method for manufacturing an electronic element in accordance with the present invention is characterized in comprising: a step of forming, on a surface of a wafer having a plurality of electrode pads, a dielectric film having opening sections over the electrode pads; a step of forming a first metal layer inside each of the opening sections and on the dielectric film; a step of forming a second metal layer on the first metal layer; and a step of forming bumps over the electrode pads through the first and second metal layers, wherein in the step of forming the first metal layer or the step of forming the second metal layer, a surface area of one of the first metal layer and the second metal layer is formed to be greater than a bottom area of each of the bumps.

A circuit substrate in accordance with the present invention is characterized in comprising: a substrate having a land composed of a conductive layer; a dielectric film provided on a surface of the substrate having the land in a manner to expose the land; a first metal layer formed on the land; a second metal layer formed on the first metal layer; and a bump formed through the first and second metal layers over the land by an electroplating process, wherein a surface area of one of the first metal layer and the second metal layer is formed to be larger than a bottom area of the bump.

A method for manufacturing a circuit substrate in accordance with the present invention is characterized in comprising: a step of forming a dielectric film on an entire surface of a substrate having a plurality of lands, the dielectric film having opening sections over the lands; a step of forming a first metal layer inside each of the opening sections and on the dielectric film; a step of forming a second metal layer on the first metal layer; and a step of forming bumps over the lands through the first and second metal layers, wherein, in the step of forming the first metal layer or the step of forming the second metal layer, a surface area of one of the first metal layer and the second metal layer is formed to be greater than a bottom area of each of the bumps.

An electronic device in accordance with the present invention is characterized in comprising: an electronic element equipped with a substrate having an electrode pad, a dielectric film provided on a surface of the substrate having the electrode pad in a manner to expose the electrode pad, a first metal layer formed on the electrode pad, a second metal layer formed on the first metal layer, and a bump formed through the first and second metal layers over the electrode pad, wherein a surface area of one of the first metal layer and the second metal layer is formed to be larger than a bottom area of the bump; and a circuit substrate having a land on a substrate, a lead wire connected to the land, and a dielectric film covering the lead wire, wherein the electronic element is mounted on the circuit substrate through connecting the bump and the land.

According to the present invention, when the bottom area of the bump is small, a large contact area between the first metal layer or the second metal layer and the dielectric film can be secured. For this reason, the adhesion between either the first metal layer or the second metal layer and the dielectric film can be increased, and peeling of the bump from the substrate during or after mounting can be prevented. Electronic devices that use such electronic elements and circuit substrates described above are highly reliable in electrical connection with bumps and wiring patterns on the circuit substrates.

DETAILED DESCRIPTION

Embodiments of the present invention will be described below.

Figure 1:
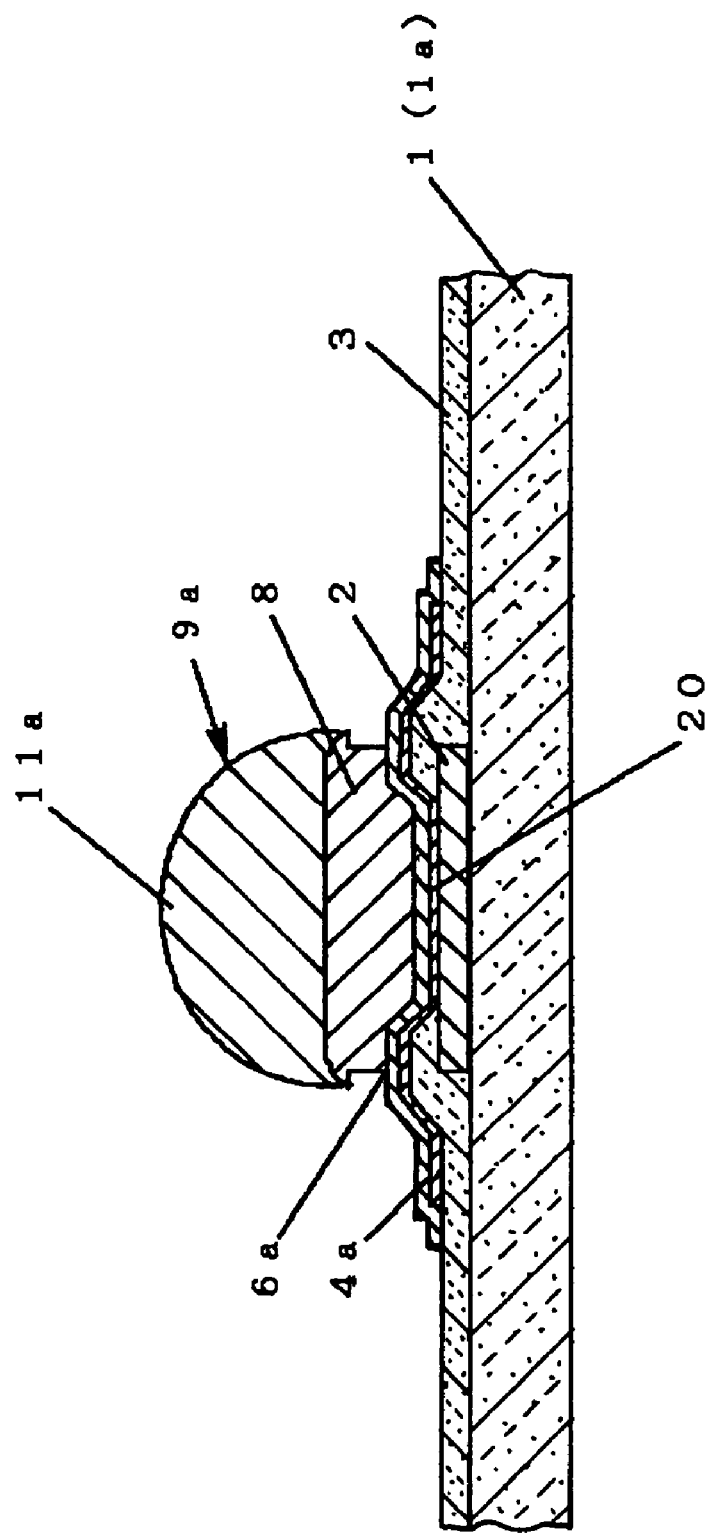
FIG. 1 is a view indicating an electronic element among electronic elements in accordance with one embodiment of the present invention.
Figure 2:
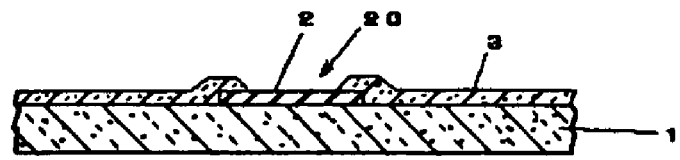
FIGS. 2a–g are views illustrating steps for describing a method for manufacturing an electronic element in accordance with one embodiment of the present invention.
Figure 2:
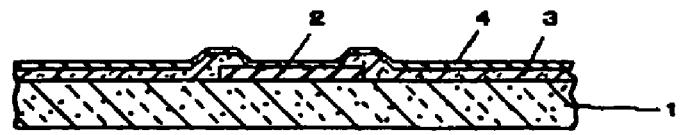
Figure 2:
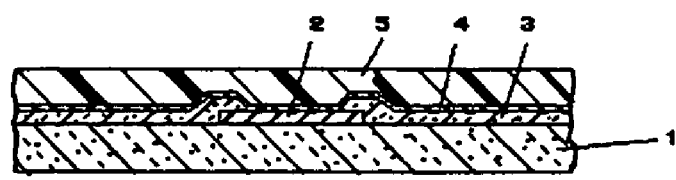
Figure 2:
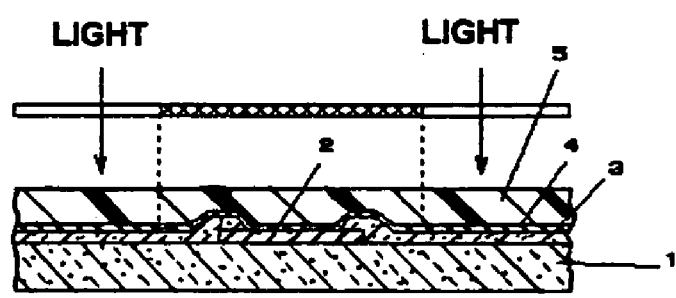
Figure 2:
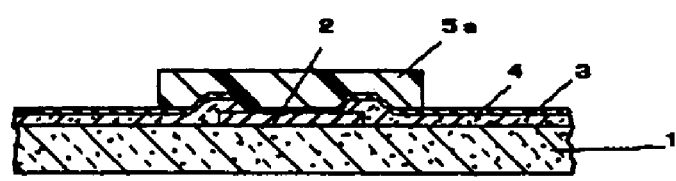
Figure 2:
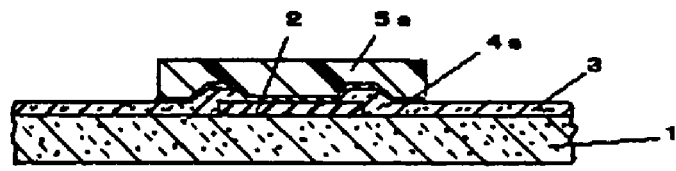
Figure 2:
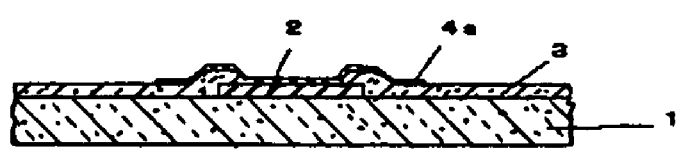
Figure 3:
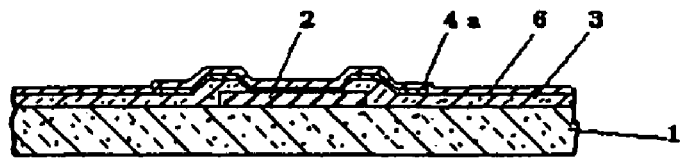
FIGS. 3a–f are views illustrating steps for describing a method for manufacturing the electronic element in accordance with one embodiment of the present invention.
Figure 3:
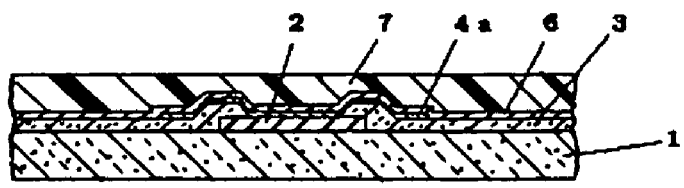
Figure 3:
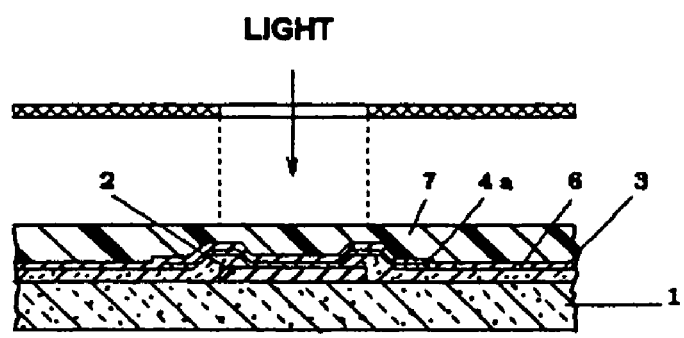
Figure 3:
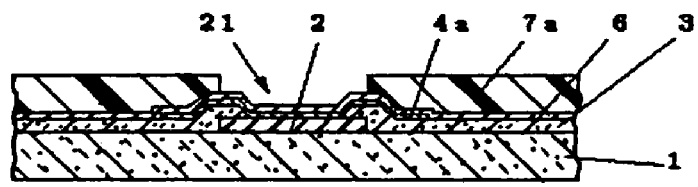
Figure 3:
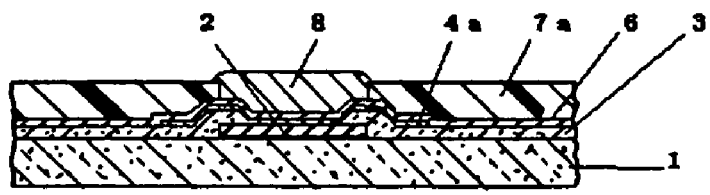
Figure 3:
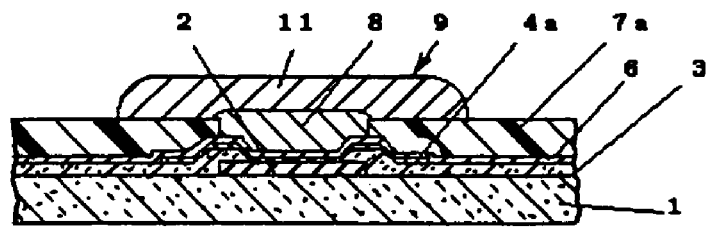
Figure 4:
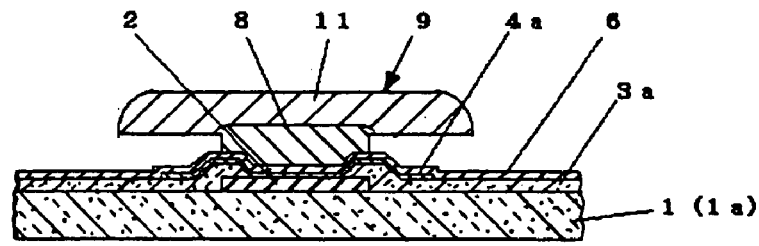
FIGS. 4a–d are views illustrating steps for describing a method for manufacturing the electronic element in accordance with one embodiment of the present invention.
Figure 4:
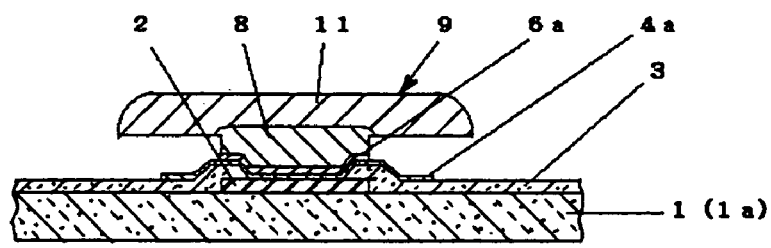
Figure 4:
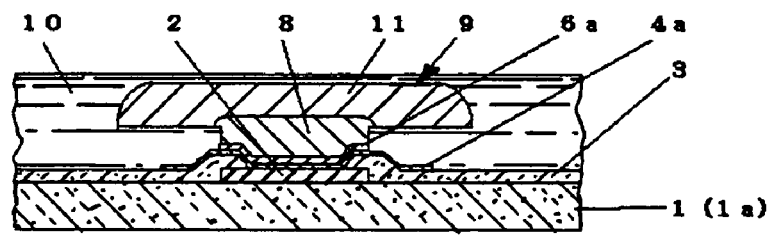
Figure 4:
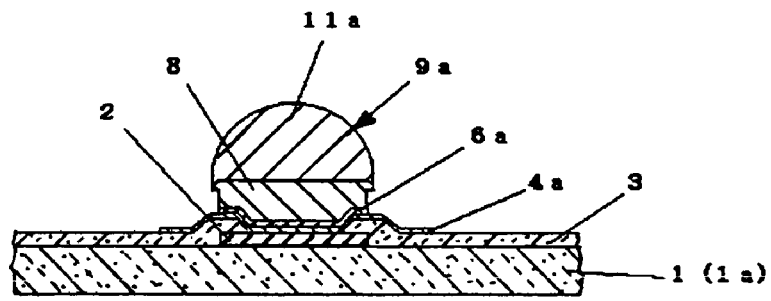
Figure 5:
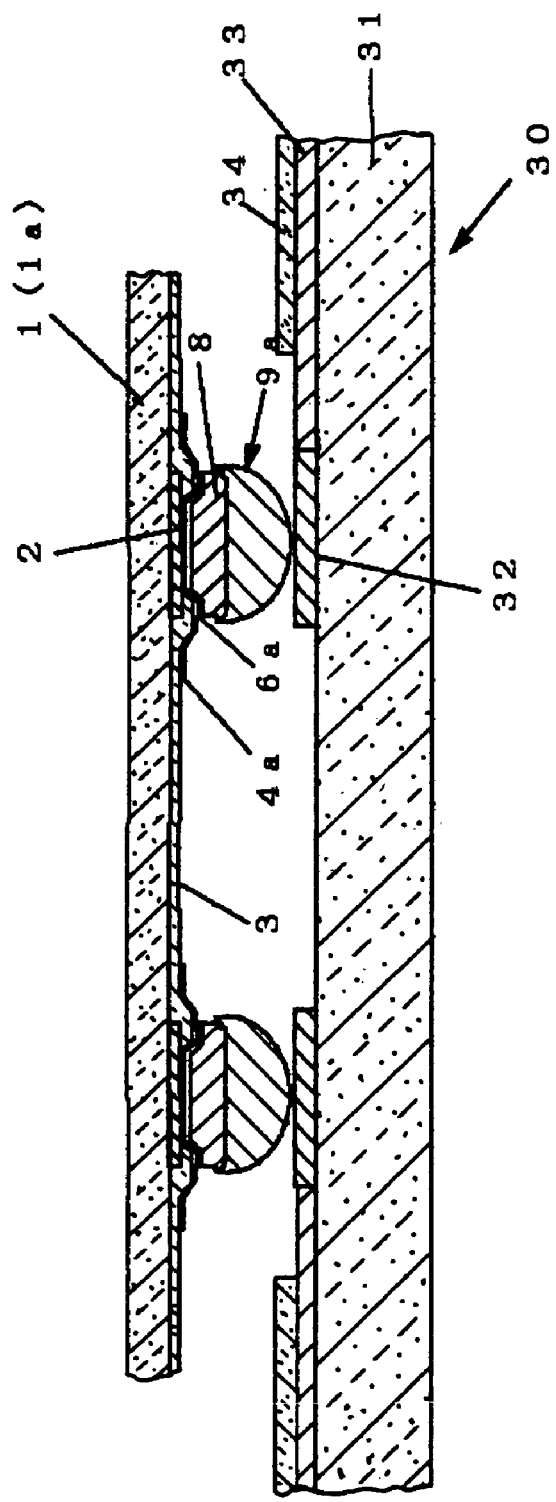
FIG. 5 is a view for describing a method for manufacturing an electronic device in accordance with one embodiment of the present invention.
Figure 6:
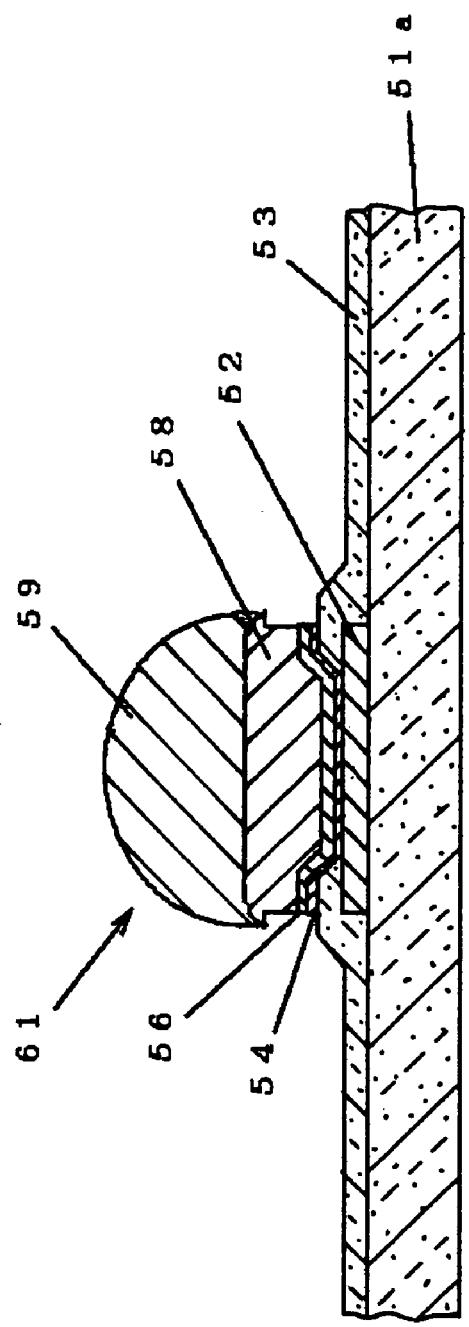
FIG. 6 is a view of one example of a conventional electronic element.

FIG. 1 is a view illustrating an electronic element in accordance with an embodiment of the present invention, FIGS. 2–4 are views illustrating steps for describing a method for manufacturing an electronic element in accordance with an embodiment of the present invention, FIG. 5 is a view for describing a method for manufacturing an electronic device in accordance with an embodiment of the present invention.

The electronic element in accordance with one embodiment of the present invention will be described with reference to FIG. 1. The electronic element includes a substrate 1 (1a) provided on its surface with an electrode pad 2 and a dielectric film 3 formed in a manner to avoid the electrode pad 2. A metal layer 4a is formed on the electrode pad 2. Further, a bump 9a is formed above the electrode pad 2 through a protruded electrode 8.

The substrate 1 (1a) may be a chip 1a having an integrated circuit provided on its inside or a wafer 1. The substrate 1 (1a) may include a semiconductor substrate. In this case, the electrode pad 2 is electrically connected to an internal integrated circuit via internal wirings, and the internal wirings are insulated by interlayer dielectric films provided between the internal wirings. In this case, the electrode pad 2 is located on the uppermost surface layer among the interlayer dielectric films. The dielectric film 3 on the substrate 1 (1a) includes an opening section 20 provided over the electrode pad 2.

At least a metal layer 4a and a metal layer 6a provided in the opening section 20 of the dielectric film 3 are formed over the electrode pad 2 and the dielectric film 3. The surface area of at least one of the metal layer 4a and the metal layer 6a is formed to be greater than the bottom area of the bump 9a. Accordingly, even when the bottom area of the bump 9a is small, the adhesion supporting strength between the metal layer 4a and the dielectric film 3 can be secured. At least one of the metal layer 4a and the metal layer 6a is provided inside the opening section 20, and may adhere to the dielectric film 3 outside the opening section 20. The surface area of at least one of the metal layer 4a and the metal layer 6a is greater than the area of the opening section 20. At least one of the metal layer 4a and the metal layer 6a may have a surface area greater than the surface area of the other of the metal layer 4a and the metal layer 6a. In this case, at least a part of the metal layer that is broader is provided in contact with the dielectric film 3. In other words, when the surface area of the metal layer 4a is greater than the surface area of the metal layer 6a, and the surface area of the metal layer 4a is greater than the bottom area of the bump 9a, at least a part of the metal layer 4a is in contact with the top of the dielectric film 3 outside the opening section 20. Also, when the surface area of the metal layer 6a is greater than the surface area of the metal layer 4a, and the surface area of the metal layer 6a is greater than the bottom area of the bump 9a, at least a part of the metal layer 6a is in contact with the top of the dielectric film 3 outside the opening section 20.

The metal layer 4a and the metal layer 6a include portions that are located between the electrode pad 2 and the bump 9a. The metal layer 4a and the metal layer 6a have at least different properties. The metal layer 4a and the metal layer 6a may be formed from conductive materials, or may be composed of layers having surface properties, which are different from those of the material of the bump 9a. For example, the metal layer 4a may be a metal diffusion prevention layer, and the metal layer 6a may be a plating electrode layer. Or, the metal layer 4a may be a plating electrode layer, and the metal layer 6a may be a metal diffusion prevention layer. The metal diffusion prevention layer is composed of a conductive material having a lower diffusion coefficient with respect to the electrode pad 2 than that of the material composing the bump 9a. The plating electrode layer is a conductive layer that is used as an electrode for supplying electric current in a forming region of the bump 9a above the electrode pad 2. Each of the metal layer 4a and the metal layer 6a can be referred to as an under bump metal (UBM). Also, there may be provided between the metal layer 4a and the metal layer 6a an adhesion layer composed of a conductive material having a higher adhesion with the metal layer 4a and the metal layer 6a than the adhesion between the metal layer 4a and the metal layer 6a.

The bump 9a includes a conductive layer. The conductive layer may be formed from a metal layer composed of metal, metal compound or alloy, or may be formed from conductive paste or the like. When mounting on a mounting substrate or the like having lead wires by a flip-chip method, the bump 9a maintains a separation between the mounting substrate and the substrate 1a. For this reason, the bump 9a is thicker than the metal layer 4a or the metal layer 6a. The conductive layer may be formed by an electroplating method. For example, the bump 9a may comprise a single layer, that is composed of Ni, Au or the like, for example, Alternatively, the bump 9a may be formed from multiple conductive layers, which may include the protruded electrode 8 and a bonding layer 11a provided on the protruded electrode 8. In this case, the bonding layer 11a may be composed of a conductive material having a lower melting point than that of the conductive material composing the protruded electrode 8. The bonding layer 11a may be formed from a solder material such as Sn—Ag or the like. The bump 9a may have a straight side surface.

In the present embodiment, an embodiment example including two metal layers of the metal layer 4a and the metal layer 6a is described. However, a single metal layer may be provided, or a plurality of more than two layers may be provided. Also, in the present embodiment, an electronic element is described. However, a similar structure is also applicable to a circuit substrate. In this case, the bump 9a is formed on a land 32 to be described below. In other words, the bump 9a is provided over the land 32, instead of over the electrode pad 2.

Next, a method for manufacturing an electronic element in accordance with one embodiment of the present invention will be described with reference to FIGS. 2–4.

First, a conductive film 4 is formed, as shown in FIG. 2 (b), over the entire surface of a substrate 1 (1a) having an electrode pad 2 and a dielectric film 3 having an opening section 20 that exposes at least a part of the electrode pad 2 shown in FIG. 2 (a). The conductive film 4 may be formed by a sputter method or a CVD method. At least the conductive film 4 is provided over the electrode pad 2 inside the opening section 20.

As indicated in FIGS. 2(c)–(f), the conductive film 4 is patterned to form a metal layer 4a. In this instance, as indicated in FIGS. 2(c)–(e), a photosensitive resin layer 5 may be provided over the conductive film 4, and areas except a portion of the photosensitive resin layer 5 are exposed to develop the photosensitive resin layer 5, thereby forming a mask 5a. In this case, as indicated in FIGS. 2 (f)–(g), by using the mask 5a, a part of the conductive film 4 is removed by etching, to thereby form the metal layer 4a. The etching may be dry etching or wet etching.

Next, as indicated in FIG. 3 (a), a conductive film 6 is formed over the entire surface of the substrate 1 (1a). Then, as indicated in FIGS. 3 (b)–(f), a bump 9 is formed over the electrode pad 2. In this instance, a mask 7a having an opening section 21 over the electrode pad 2 is formed on the conductive layer 6. When the surface area of the metal layer 4a is provided to be greater than the bottom area of the bump 9a, the open area of the opening section 21 is made smaller than the surface area of the metal layer 4a. Accordingly, the surface area of the metal layer 4a becomes greater (larger) than the bottom area of the bump 9a that is formed later in the opening section 21.

Then, as indicated in FIGS. 4 (a)–(d), a bump 9 is formed in an opening section 21 above the electrode pad through the metal layer 4a and conductive layer 6. Then, the substrate 1 (1a) is submerged in plating solution, and current is applied to the conductive film 6, to thereby form the bump 9 at least inside the opening section 21. For example, as the bump 9, a protruded electrode 8 is formed. The protruded electrode 8 is formed to be thicker than the metal layer 4a or the conductive film 6. Then, as indicated in FIG. 3 (f), a bonding layer 11 may be further provided on the protruded electrode 8, to thereby define the bump 9. The bonding layer may be provided over the protruded electrode 8 and the mask 7a. As a result, the bump 9 in the shape of a mushroom can be formed.

Next, as indicated in FIGS. 4 (a)–(d), a metal layer 6a is formed by patterning the conductive film 6. For example, as indicated in FIG. 4 (a), the mask 7a indicated in FIG. 3 (f) is removed. When the surface area of the metal layer 6a is made to be greater than the bottom area of the bump 9, the conductive film 6 is removed by etching while a part of the mask 7a is removed, but left around the opening section 21. Then, as indicated in FIG. 4 (c), flux 10 is coated over the dielectric film 3 to cover the bump 9. Then, as indicated in FIG. 4 (d), heat treatment of the bonding layer 11 and the removal of the flux 10 may be conducted.

Accordingly, a bump 9a having a specified height is formed on the electrode pad 2. Then, when the substrate 1 (1a) is a wafer 1, the wafer 1 is cut into individual segments, such that electronic elements having chips 1a are formed.

Also, in the present embodiment, a method for manufacturing an electronic element is described. However, a similar method may be used to form a bump 9a on a land 32 of a circuit substrate to be described below. In this case, the bump 9a is not provided over the electrode pad 2, but provided over the land 32.

Next, a method for manufacturing an electronic device will be described.

First, an electronic device indicated in FIG. 5 is in a state in which an electronic element described above is connected to a circuit substrate 30 by a face down bonding method. Here, the circuit substrate 30 is equipped with a lead wire 33 connected to a land 32, and a dielectric film 34 that covers the lead wire 33.

When the electronic element in accordance with the embodiment of the present invention is mounted on the circuit substrate 30, the bump 9 is bonded to a portion of the land 32. In this instance, the bump 9a and the land 32 may be bonded through adhesive bonding or metal bonding. For example, in the case of adhesive bonding, adhesive such as ACF (Anisometric Conductive Film), NCF (Non Conductive Film), ACP (Anisometric Conductive Paste), NCP (Non Conductive Paste) or the like is provided, the bump 9 of the electronic element is aligned with the land 32 of the substrate 31, and the bump 9 and the land 32 are bonded together by a pressing force. Then, the electronic element may be molded with epoxy resin or the like. As a mounting method, TAB (Tape Automated Bonding), COF (Chip on Film) or COG (Chip of Glass) may be used.

EFFECTS OF THE INVENTION

By the electronic element, the method for manufacturing the electronic element, the circuit substrate, the method for manufacturing the circuit substrate, the electronic device and the method for manufacturing the electronic device in accordance with the present invention, a dielectric film is formed over a surface of a wafer having an electrode pad in a manner to expose the electrode pad, a first metal layer is formed over the electrode pad and the dielectric film, a second metal layer is formed on the first metal layer, and a bump is formed over the electrode pad through the first and second metal layers, wherein the surface area of one of the first metal layer and the second metal layer is formed to be greater than the bottom area of the bump. As a result, the adhesion of the bump with the electrode pad and the land can be improved.

What is claimed is:

1. An electronic element comprising:
   a substrate having an electrode pad;
   a dielectric film provided on a surface of the substrate and exposing the electrode pad;
   a first metal layer formed on the electrode pad;
   a second metal layer formed on the first metal layer; and
   a bump formed through the first and second metal layers over the electrode pad,
   wherein a surface area of one of the first metal layer and the second metal layer is larger than a bottom area of the bump, and
   wherein the surface area of the second metal layer is greater than the surface area of the first metal layer, the dielectric film has an opening section over the electrode pad, and the second metal layer coats and attaches a top of the dielectric film outside the opening section and inside the opening section.

2. The electronic element according to claim 1, wherein the surface area of the first metal layer is greater than the bottom area of the bump.

3. The electronic element according to claim 1, wherein the first metal layer comprises a metal diffusion prevention layer including a material having a lower diffusion coefficient for the electrode pad than a material composing the bump.

4. The electronic element according to claim 1, wherein the bump comprises an electroplated bump, and the second metal layer comprises a plating electrode supplying electric current to a forming region of the bump above the electrode pad.

5. The electronic element according to claim 1, wherein the first metal layer coats and attaches a top of the dielectric film outside the opening section and inside the opening section.

6. A method for manufacturing an electronic element comprising:
 a step of forming a dielectric film on a surface of a wafer, the wafer having a plurality of electrode pads and the dielectric film having opening sections over the electrode pads;
 a step of forming a first metal layer inside each of the opening sections and on the dielectric film;
 a step of forming a second metal layer on the first metal layer, the surface area of the second metal layer being greater than the surface area of the first metal layer; and
 a step of forming bumps over the electrode pads through the first and second metal layers,
 wherein in at least one of the step of forming the first metal layer and the step of forming the second metal layer, a surface area of one of the first metal layer and the second metal layer is formed to be greater than a bottom area of each of the bumps, and
 wherein the second metal layer coats and attaches a top of the dielectric film outside each of the opening sections and inside each of the opening sections.

7. The method for manufacturing an electronic element according to claim 6, wherein, in the step of forming the first metal layer, the surface area of the first metal layer is formed to be greater than the bottom area of the bump.

8. The method for manufacturing an electronic element according to claim 6, wherein the first metal layer is formed with a material having a lower diffusion coefficient for the electrode pad than a material composing the bump.

9. The method for manufacturing an electronic element according to claim 6, wherein the bumps are formed by a plating method through supplying electric current above the electrode pads by the second metal layer.

10. A circuit substrate comprising:
 a substrate having a land composed of a conductive layer;
 a dielectric film provided on a surface of the substrate and exposing the land;
 a first metal layer formed on the land;
 a second metal layer formed on the first metal layer; and
 an electroplated bump formed through the first and second metal layers over the land,
 wherein a surface area of one of the first metal layer and the second metal layer is larger than a bottom area of the bump, and
 wherein the surface area of the second metal layer is greater than the surface area of the first metal layer, the dielectric film has an opening section over the land, and the second metal layer coats and attaches a top of the dielectric film outside the opening section and inside the opening section.

11. A method for manufacturing a circuit substrate, comprising:
 a step of forming a dielectric film on an entire surface of a substrate, the substrate having a plurality of lands and the dielectric film having opening sections over the lands;
 a step of forming a first metal layer inside each of the opening sections and on the dielectric film;
 a step of forming a second metal layer on the first metal layer, the surface area of the second metal layer being greater than the surface area of the first metal layer; and
 a step of forming bumps over the lands through the first and second metal layers,
 wherein, in at least one of the step of forming the first metal layer and the step of forming the second metal layer, a surface area of one of the first metal layer and the second metal layer is formed to be greater than a bottom area of each of the bumps, and
 wherein the second metal layer coats and attaches a top of the dielectric film outside each of the opening sections and inside each of the opening sections.

* * * * *